(12) United States Patent
Lin et al.

(10) Patent No.: US 11,932,534 B2
(45) Date of Patent: Mar. 19, 2024

(54) MEMS DEVICE HAVING A METALLIZATION STRUCTURE EMBEDDED IN A DIELECTRIC STRUCTURE WITH LATERALLY OFFSET SIDEWALLS OF A FIRST PORTION AND A SECOND PORTION

(71) Applicant: Taiwan Semiconductor Manufacturing Company, Ltd., Hsin-Chu (TW)

(72) Inventors: Hung-Hua Lin, Taipei (TW); Chang-Ming Wu, New Taipei (TW); Chung-Yi Yu, Hsin-Chu (TW); Ping-Yin Liu, Yonghe (TW); Jung-Huei Peng, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 130 days.

(21) Appl. No.: 17/696,299

(22) Filed: Mar. 16, 2022

(65) Prior Publication Data
US 2022/0204340 A1   Jun. 30, 2022

Related U.S. Application Data

(60) Continuation of application No. 16/384,066, filed on Apr. 15, 2019, now Pat. No. 11,279,615, which is a
(Continued)

(51) Int. Cl.
*B81C 1/00* (2006.01)
*B81B 7/00* (2006.01)
*H01L 23/00* (2006.01)

(52) U.S. Cl.
CPC .......... *B81C 1/00238* (2013.01); *B81B 7/008* (2013.01); *B81C 1/00333* (2013.01);
(Continued)

(58) Field of Classification Search
CPC ............ B81C 1/00238; B81C 1/00333; B81C 2201/0132; B81C 2203/0109;
(Continued)

(56) References Cited

U.S. PATENT DOCUMENTS 9,048,283 B2   6/2015   Liu et al.
9,290,376 B1   3/2016   Cheng et al.
(Continued)

FOREIGN PATENT DOCUMENTS

CN   102935994 A   2/2013
CN   103145088 A   6/2013
(Continued)

OTHER PUBLICATIONS

U.S. Appl. No. 15/665,517, filed Aug. 1, 2017.
(Continued)

*Primary Examiner* — Ermias T Woldegeorgis
(74) *Attorney, Agent, or Firm* — Eschweiler & Potashnik, LLC

(57) ABSTRACT

A microelectromechanical system (MEMS) structure and method of forming the MEMS device, including forming a first metallization structure over a complementary metal-oxide-semiconductor (CMOS) wafer, where the first metallization structure includes a first sacrificial oxide layer and a first metal contact pad. A second metallization structure is formed over a MEMS wafer, where the second metallization structure includes a second sacrificial oxide layer and a second metal contact pad. The first metallization structure and second metallization structure are then bonded together. After the first metallization structure and second metallization structure are bonded together, patterning and etching the MEMS wafer to form a MEMS element over the second sacrificial oxide layer. After the MEMS element is formed, removing the first sacrificial oxide layer and second sacri-
(Continued)

ficial oxide layer to allow the MEMS element to move freely about an axis.

20 Claims, 8 Drawing Sheets

Related U.S. Application Data division of application No. 15/855,449, filed on Dec. 27, 2017, now Pat. No. 10,294,098.

(60) Provisional application No. 62/563,977, filed on Sep. 27, 2017.

(52) U.S. Cl.
CPC .............. *H01L 24/09* (2013.01); *H01L 24/89* (2013.01); *B81B 2207/07* (2013.01); *B81C 2201/0132* (2013.01); *B81C 2203/0109* (2013.01); *B81C 2203/0785* (2013.01); *B81C 2203/0792* (2013.01); *H01L 2224/091* (2013.01); *H01L 2224/80013* (2013.01); *H01L 2224/80895* (2013.01)

(58) Field of Classification Search
CPC .... B81C 2203/0785; B81C 2203/0792; B81C 3/001; B81C 2203/03; B81C 1/00269; B81C 2203/01; B81B 7/008; B81B 2207/07; B81B 7/0006; B81B 7/02; B81B 2201/0235; B81B 2201/0242; B81B 2201/0264; B81B 7/0032; H01L 24/09; H01L 24/89; H01L 2224/091; H01L 2224/80013; H01L 2224/80895
See application file for complete search history.

(56) References Cited

U.S. PATENT DOCUMENTS

| | | | |
|---|---|---|---|
| 9,540,231 | B2 | 1/2017 | Chang et al. |
| 9,630,834 | B2 | 4/2017 | Tayebi et al. |
| 9,761,557 | B2 | 9/2017 | Shin et al. |
| 10,002,844 | B1 | 6/2018 | Wang et al. |
| 2004/0100594 | A1 | 5/2004 | Huibers et al. |
| 2007/0082420 | A1 | 4/2007 | Milne |
| 2010/0127339 | A1 | 5/2010 | Laermer |
| 2010/0193884 | A1 | 8/2010 | Park |
| 2010/0291410 | A1 | 11/2010 | Novotny et al. |
| 2012/0244677 | A1 | 9/2012 | Lin et al. |
| 2014/0353774 | A1 | 12/2014 | Zhang et al. |
| 2014/0374856 | A1 | 12/2014 | Chen |
| 2015/0111332 | A1 | 4/2015 | Lee |
| 2015/0129991 | A1 | 5/2015 | Lee et al. |
| 2015/0353353 | A1 | 12/2015 | Zhang |
| 2016/0002028 | A1* | 1/2016 | Smeys ................ B81C 1/00238 438/51 |
| 2016/0031704 | A1 | 2/2016 | Shen et al. |
| 2016/0083247 | A1 | 3/2016 | Daneman et al. |
| 2016/0185592 | A1* | 6/2016 | Hsieh ...................... C23C 16/50 257/415 |
| 2016/0207756 | A1 | 7/2016 | Chang et al. |
| 2016/0332863 | A1 | 11/2016 | Cheng et al. |
| 2017/0066648 | A1 | 3/2017 | Lee |
| 2017/0098509 | A1 | 4/2017 | Gupta et al. |
| 2017/0107097 | A1 | 4/2017 | Cheng et al. |
| 2018/0057351 | A1 | 3/2018 | Yama |

FOREIGN PATENT DOCUMENTS

| | | |
|---|---|---|
| CN | 103879952 A | 6/2014 |
| CN | 104003348 A | 8/2014 |
| TW | 201340734 A | 10/2013 |
| TW | 201546887 A | 12/2015 |

OTHER PUBLICATIONS

Maboudian, Roya. "Surface Processes in MEMS Technology." Surface Science Reports 30 (1998) 207-269.
Zhuang, et al. "Vapor Phase Self-assembled Monolayers for Anti-stiction Applications in MEMS." IEEE Journal of Microelectromechanical Systems, 16(6), 1451-1460. Published in 2007.
Non-Final Office Action dated May 9, 2018 in connection with U.S. Appl. No. 15/665,517.
Final Office Action dated Nov. 29, 2018 in connection with U.S. Appl. No. 15/665,517.
Ex-Parte Quayle Office Action dated Dec. 10, 2018 for U.S. Appl. No. 15/855,449.
Notice of Allowance dated Feb. 12, 2019 for U.S. Appl. No. 15/855,449.
Final Office Action dated Dec. 23, 2019 in connection with U.S. Appl. No. 15/665,517.
Notice of Allowance dated Jan. 6, 2020 in connection with U.S. Appl. No. 16/199,461.
Non-Final Office Action dated Jan. 4, 2021 for U.S. Appl. No. 16/384,066.
Final Office Action dated Jul. 28, 2021 for U.S. Appl. No. 16/384,066.
Notice of Allowance dated Nov. 10, 2021 for U.S. Appl. No. 16/384,066.

\* cited by examiner

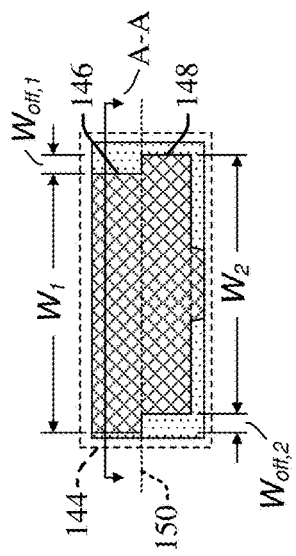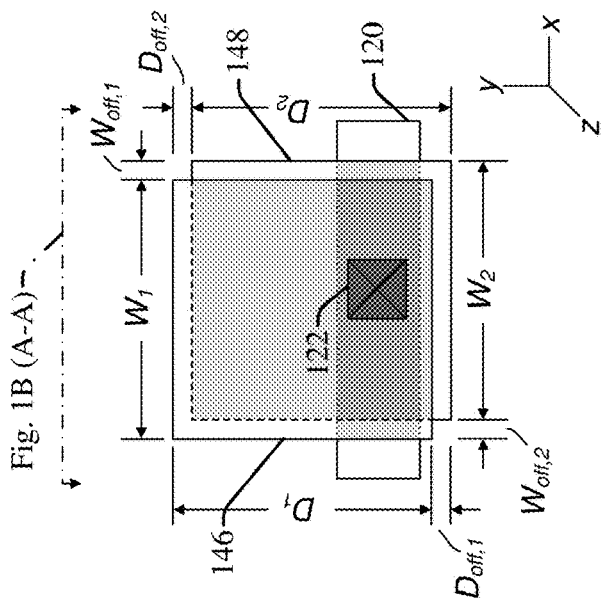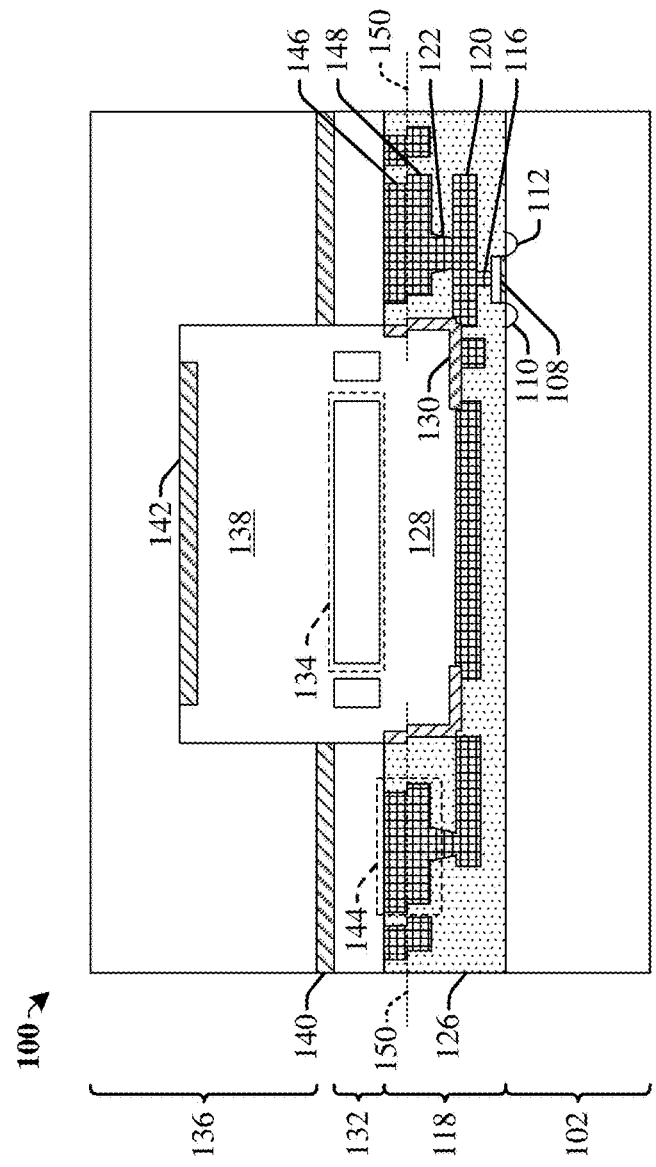

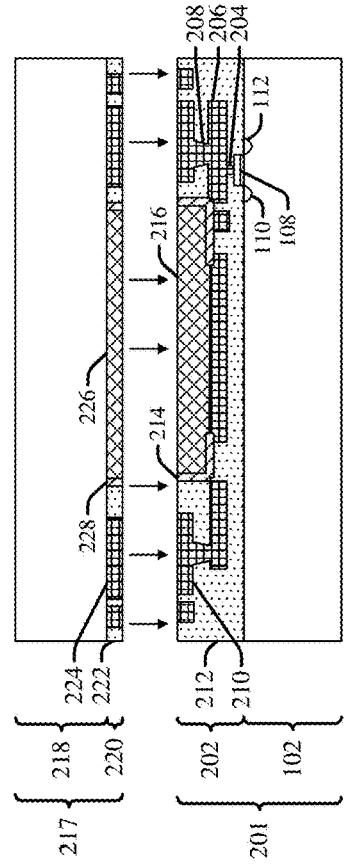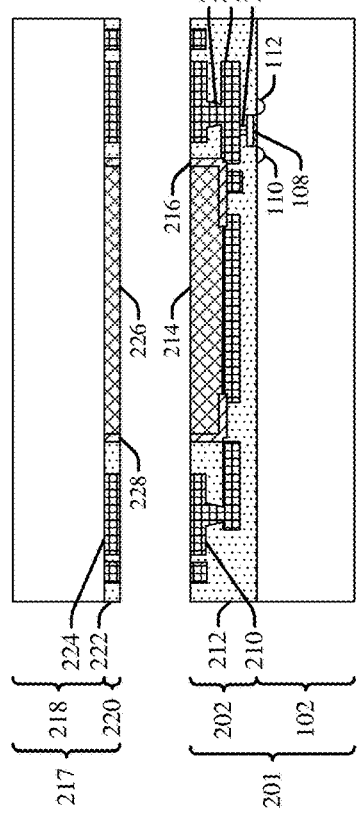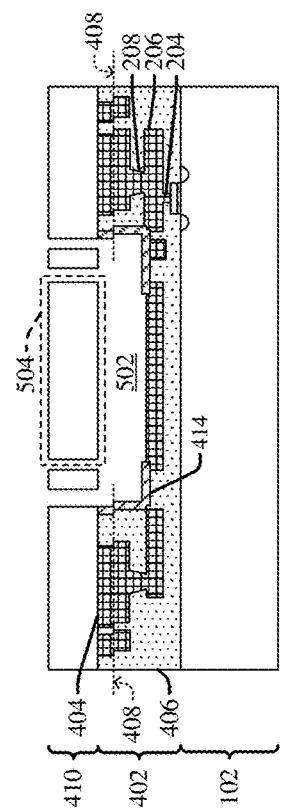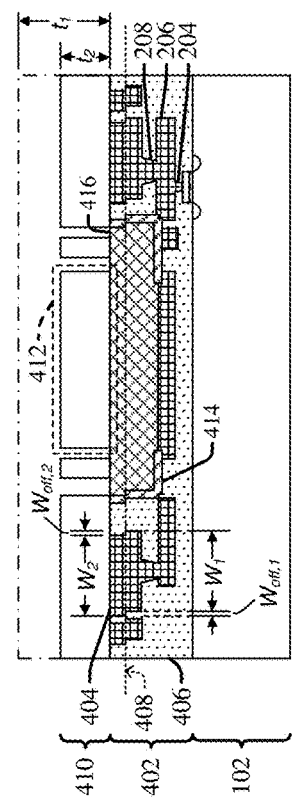

MEMS DEVICE HAVING A METALLIZATION STRUCTURE EMBEDDED IN A DIELECTRIC STRUCTURE WITH LATERALLY OFFSET SIDEWALLS OF A FIRST PORTION AND A SECOND PORTION

REFERENCE TO RELATED APPLICATIONS

This application is a Continuation of U.S. application Ser. No. 16/384,066, filed on Apr. 15, 2019, which is a Divisional of U.S. application Ser. No. 15/855,449, filed on Dec. 27, 2017 (now U.S. Pat. No. 10,294,098, issued on May 21, 2019), which claims the benefit of U.S. Provisional Application No. 62/563,977, filed on Sep. 27, 2017. The contents of the above-referenced patent applications are hereby incorporated by reference in their entirety.

BACKGROUND

Microelectromechanical systems (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to application-specific integrated circuits (ASICs) to form MEMS systems. Generally, a plurality of wafers are bonded together (e.g., fusion, eutectic, etc.) to form the complete MEMS system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A illustrates a cross-sectional view of some embodiments of a MEMS device formed in accordance with the improved method for packaging wafers of the present disclosure.

FIG. 1B illustrates a magnified cross-sectional view of some embodiments of a portion of the MEMS device illustrated in FIG. 1A.

FIG. 1C illustrates some embodiments of a portion of a top view of FIG. 1B along line A-A.

FIGS. 2-6 illustrate a series of cross-sectional views of some embodiments of a method for manufacturing a MEMS device by first hybrid bonding a CMOS wafer, which includes a number of CMOS integrated circuits (ICs), to a MEMS wafer, which includes a number of MEMS ICs, and then fusion bonding a cap wafer to the MEMS wafer.

DETAILED DESCRIPTION

Figure 6:
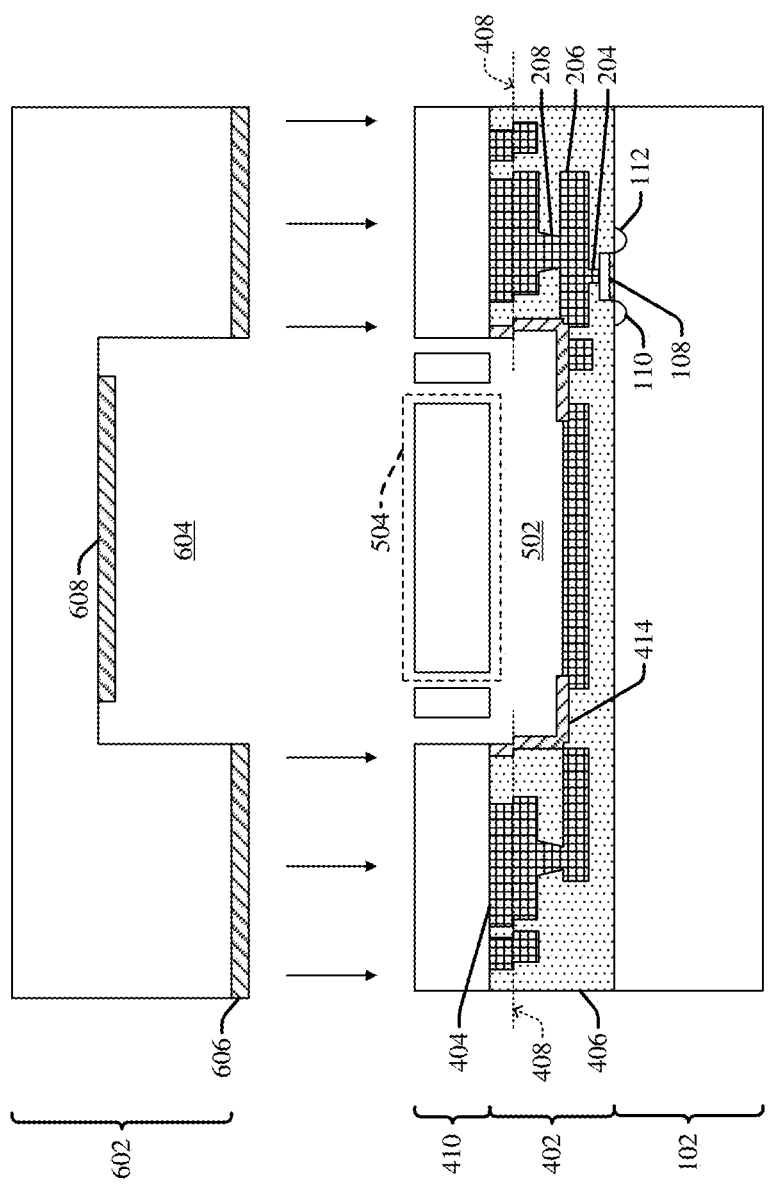

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some microelectromechanical systems (MEMS) devices, such as accelerometers and gyroscopes, comprise a moveable element and a neighboring fixed electrode plate arranged within a cavity. The moveable element is moveable or flexible with respect to the fixed electrode plate in response to external stimuli, such as acceleration, pressure, or gravity. A distance variation between the moveable element and the fixed electrode plate is detected through a capacitive coupling of the moveable element and the fixed electrode plate and transmitted to a measurement circuit for further processing.

Some MEMS devices, such as accelerometers and gyroscopes, may require the cavity to be hermetically sealed for optimal performance. For example, a MEMS device comprising a movable element in a hermetically sealed cavity allows a manufacturer to control the environmental factors (e.g., pressure, gas composition, etc.) surrounding the movable element. This control ensures the MEMS device can accurately measure a desired stimuli and may increase the lifetime of the MEMS device. On the other hand, some MEMS devices, such as gas sensors and humidity sensors, require a non-hermetically sealed environment that is open to the ambient environment to accurately measure a desired stimuli.

During the bulk manufacture of MEMS devices according to some methods, a cap wafer (also called a cap substrate) is formed, which may be arranged over and bonded to a MEMS wafer (also called a MEMS substrate), which may comprise a plurality of MEMS devices. The cap wafer is typically bonded to the MEMS wafer by a fusion bond. In accordance with one example, a eutectic bonding substructure may be formed over a surface of the MEMS wafer. After the cap wafer and MEMS wafer are bonded together, the MEMS devices are further formed within the MEMS wafer, for example, by using various patterning and etching methods to create a moveable element.

In some embodiments, after the cap wafer and MEMS wafer are bonded together, a complementary metal-oxide-semiconductor (CMOS) wafer (also called a CMOS substrate), which may comprise supporting logic for the associated MEMS devices, is bonded to the MEMS wafer. The CMOS wafer is typically bonded to the MEMS wafer using the eutectic bonding substructure for eutectic bonding. With the CMOS wafer bonded to the MEMS substrate, the wafers are singulated into dies, each including at least one MEMS device, and packaging is completed.

Due to the moveable or flexible parts, MEMS devices have several production challenges that are not encountered with conventional CMOS circuits. One challenge is increasing the number of MEMS wafers that may be bonded per hour while ensuring quality hermetic sealing and electrical characterization. Another challenge is limiting the negative effects of poor overlay accuracy that may occur during wafer packaging. For example, in typical MEMS wafer level packaging (e.g., where a cap wafer is bonded to a MEMS wafer by a eutectic bond), a eutectic bonding material (e.g., Germanium) must be disposed between the cap wafer and the MEMS wafer and the MEMS wafer must also comprise a specific material (e.g., AlCu) to ensure a eutectic process. The eutectic bond process is then carried out at a relatively high temperature and high pressure. Because of these process parameters, only a relatively small number of MEMS wafers (e.g., 1-2 wafers per hour) may go through the eutectic bonding process per hour, which increases the cost of manufacturing MEMS devices. Further, due to these process parameters, the eutectic bonding process makes it difficult to ensure accurate overlay control and may require relatively large overlay corrections (e.g., 8-10 µm), which limits the reduction of critical dimensions in MEMS devices. Therefore, a method for wafer level packaging that achieves quality hermetic sealing and electrical characterization while increasing the number of wafers bonded per hour and increasing overlay control would improve the reliability and cost of MEMS devices.

The present disclosure relates to an improved method (and related apparatus) for packaging wafers that increases the number of MEMS devices that can be manufactured per hour (e.g., 5-10 wafers per hour) and improves the overlay accuracy of MEMS wafer packaging (e.g., about 1 µm or less of overlay correction). In some embodiments, the method comprises forming a first metallization structure over a CMOS wafer and forming a second metallization structure over a MEMS wafer. The first metallization structure comprises a first sacrificial oxide layer, a first metal contact pad, and a first interlayer dielectric (ILD) material. The second metallization structure comprises a second sacrificial oxide layer, a second metal contact pad, and a second ILD material. A top surface of the first metallization structure is then hybrid bonded to a top surface of the second metallization structure. After the first metallization structure and second metallization structure are bonded together, MEMS devices are formed in the MEMS wafer, for example, by patterning the MEMS wafer and subsequently etching the first and second sacrificial layers. After the MEMS devices are formed in the MEMS wafer, a cap wafer is fusion bonded to the MEMS wafer. Accordingly, because the improved method alters the typical MEMS wafer packaging process to eliminate the eutectic bond, this improved method increases the number of MEMS devices that can be manufactured per hour and improves the overlay accuracy of wafer packaging.

FIG. 1A illustrates a cross-sectional view of some embodiments of a MEMS device 100 formed in accordance with the improved method for packaging wafers of the present disclosure.

As illustrated in FIG. 1A, the MEMS device 100 comprises a CMOS substrate 102. The CMOS substrate 102 may comprise any type of semiconductor body (e.g., monocrystalline silicon/CMOS bulk, SiGe, silicon on insulator (SOI), etc.). The CMOS substrate 102 may also comprise one or more semiconductor devices (e.g., transistor, resistor, diode, etc.). In some embodiments, the semiconductor device is disposed over/within the CMOS substrate 102 in a front-end-of-line (FEOL) process. For example, the semiconductor device may be a transistor comprising a gate stack 108 (e.g., a metal gate disposed over a high-k dielectric) disposed over the CMOS substrate 102 and between a source 110 and drain 112, while the source 110 and drain 112 are disposed within the CMOS substrate 102.

A metallization structure 118 is disposed over the CMOS substrate 102. In some embodiments, the metallization structure 118 is formed in a back-end-of-line (BEOL) process. The metallization structure 118 may comprise a plurality of conductive features, for example, a conductive contact 116, conductive line 120, conductive via 122, and contact pad 148 formed within an ILD material 126. The conductive features may comprise a metal, such as copper, aluminum, gold, silver, or other suitable metal. The ILD material 126 may comprise silicon dioxide ($SiO_2$) or other suitable oxide, such as a low-k dielectric material.

The conductive contact 116 is configured to electrically couple a portion of a semiconductor device (e.g., gate, source, drain, etc.) to a conductive line 120. In some embodiments, the metallization structure 118 may comprise one or more metal layers (e.g., metal layer 1, metal layer 2, etc.) disposed over one another. Each metal layer may comprise a conductive line 120, and a conductive via 122 may connect a conductive line 120 from a first metal layer to a conductive line 120 of a second metal layer. Some conductive vias 122 connect a conductive line 120 to a contact pad 148. In some embodiments, there are a plurality of contact pads 148 disposed within the metallization structure 118. In some embodiments, the contact pad 148 may completely surround a metallization structure opening 128. In other embodiments, a seal ring (not shown) may surround the metallization structure opening 128. The contact pad 148 may comprise a top surface that is coplanar with the top surface of the metallization structure 118 and the ILD material 126.

Moreover, the metallization structure opening 128 is disposed within the metallization structure 118. A bottom boundary of the metallization structure opening 128 may be defined by an upper surface of the metallization structure 118. Side boundaries of the metallization structure opening 128 may be defined by sidewalls of the metallization structure 118. A top boundary of the metallization structure opening 128 may be coplanar with an uppermost surface of the metallization structure 118. In some embodiments, the bottom boundary of the metallization structure opening 128 is disposed between an uppermost surface of the metallization structure 118 and an uppermost surface of the CMOS substrate 102. In some embodiments, a vapor hydrofluoric (vHF) barrier 130 is disposed along sidewalls of the metallization structure 118 that define the side boundaries of the metallization structure opening 128 and over a portion of the upper surface of the metallization structure 118 that defines the bottom boundary of the metallization structure opening 128. In other embodiments, the vHF barrier 130 may be disposed over the entire upper surface of the metallization structure 118 that defines the bottom boundary of the metallization structure opening 128.

A MEMS substrate 132 comprising a movable MEMS element 134 is disposed over the metallization structure 118. The MEMS substrate 132 may comprise any type of semiconductor body (e.g., silicon/CMOS bulk, SiGe, SOI, etc.). In various embodiments, the MEMS substrate 132 may comprise one or more MEMS devices having a moveable MEMS element 134 neighboring a fixed electrode plate. For example, in some embodiments, the MEMS device may be an accelerometer, a gyroscope, a digital compass, and/or a pressure sensor.

In some embodiments, a cap substrate 136 comprising a cavity 138 is disposed over the MEMS substrate 132. A bottom boundary of the cavity 138 may be defined by an upper surface of the cap substrate 136. Side boundaries of the cavity 138 may be defined by sidewalls of the cap substrate 136. A top boundary of the cavity 138 may be coplanar with an uppermost surface of the cap substrate 136. The cap substrate 136 may comprise any type of semiconductor body (e.g., silicon/CMOS bulk, SiGe, SOI, etc.). A dielectric bonding layer 140 may be disposed between the cap substrate 136 and the MEMS substrate 132. In some embodiments, the dielectric bonding layer 140 may comprise an oxide (e.g., $SiO_2$). In other embodiments, the cap substrate 136 may be bonded to the MEMS substrate 132 without a dielectric bonding layer 140.

In various embodiments, an outgas layer 142 may be disposed on the upper surface of the cap substrate 136 that defines the bottom boundary of the cavity 138. In some embodiments, the outgas layer 142 may comprise a dielectric material (e.g., $SiO_2$). In other embodiments, the outgas layer 142 may comprise polysilicon or any suitable metal. For example, the outgas layer 142 may comprise a dielectric material disposed on a portion of the upper surface of the cap substrate 136 that defines the bottom boundary of the cavity 138. In other embodiments, the outgas layer 142 may be disposed along the entire sidewalls of the cap substrate 136 that defines the side boundaries of the cavity 138 and on the entire upper surface of the cap substrate 136 that defines the bottom boundary of the cavity 138. The outgas layer 142 is configured to regulate the final pressure inside the cavity 138. By varying the thickness of the outgas layer 142 or the area in which the outgas layer 142 covers, the final pressure inside the cavity 138 may be controlled.

In some embodiments, the metallization structure 118 may comprise a first portion (e.g., under a bond interface 150) and a second portion (e.g., over the bond interface 150). For example, the metallization structure 118 may comprise a first portion of the metallization structure 118 that is hybrid bonded to a second portion of the metallization structure 118 along a bond interface 150. In some embodiments, prior to the first portion of the metallization structure 118 being hybrid bonded to the second portion of the metallization structure 118, the first portion of the metallization structure 118 is formed over the CMOS substrate 102 and the second portion of the metallization structure 118 is formed over the MEMS wafer. The bond interface 150 may comprise metal-to-metal bonds between a first contact pad 146 and a second contact pad 148. Further, the bond interface 150 may comprise non-metal-to-non-metal bonds between a first portion of the ILD material 126 and a second portion of the ILD material 126. Further, in some embodiments, the bond interface 150 may comprise bonds between a first portion of a vapor hydrofluoric (vHF) barrier 130 and a second portion of the vHF barrier 130. By having the bond interface 150, the number of MEMS devices formed per hour and the overlay accuracy associated with MEMS devices may be improved.

To more clearly depict some of the features of the bond interface 150, FIG. 1B illustrates a magnified viewing area 144 depicting an enlarged view of an area around the bond interface 150. The bond interface 150 may comprise a first contact pad 146 having a first contact pad width $W_1$. The bond interface 150 may also comprise a second contact pad 148 having a second contact pad width $W_2$. In some embodiments, the first contact pad width $W_1$ is substantially equal to the second contact pad width $W_2$. In other embodiments, the first contact pad width $W_1$ may be different than the second contact pad width $W_2$. In various embodiments, due to misalignment during bonding of the first contact pad 146 and the second contact pad 148, a first sidewall of the first contact pad 146 will be offset from a first sidewall of the second contact pad 148 by a first offset width $W_{off,1}$, and a second sidewall of the first contact pad 146 will be offset from a second sidewall of the second contact pad 148 by a second offset width $W_{off,2}$. In some embodiments, the first offset width $W_{off,1}$ may be substantially equal to the second offset width $W_{off,2}$. In other embodiments, the first offset width $W_{off,1}$ may be different than the second offset width $W_{off,2}$.

To further clarify some of the features of the bond interface 150, FIG. 1C illustrates some embodiments of a portion of a top view of FIG. 1B along line A-A. The first contact pad 146 comprises a first contact pad depth $D_1$, and the second contact pad 148 comprises a second contact pad depth $D_2$. In some embodiments, the first contact pad depth $D_1$ is substantially equal to the second contact pad depth $D_2$. In other embodiments, the first contact pad depth $D_1$ may be different than the second contact pad depth $D_2$. In various embodiments, due to misalignment during bonding of the first contact pad 146 and the second contact pad 148, a third sidewall of the first contact pad 146 will be offset from a third sidewall of the second contact pad 148 by a first offset depth $D_{off,1}$, and a fourth sidewall of the first contact pad 146 will be offset from a fourth sidewall of the second contact pad 148 by a second offset depth $D_{off,2}$. In some embodiments, the first offset depth $D_{off,1}$ may be substantially equal to the second offset depth $D_{off,2}$. In other embodiments, the first offset depth $D_{off,1}$ may be different than the second offset depth $D_{off,2}$.

Further, the ILD material 126 may comprise a first portion and a second portion (not shown in FIG. 1A-1C) that also has a width offset and depth offset. In some embodiments, the vHF barrier 130 may also comprise a first portion and a second portion (not shown in FIG. 1A-1C) that has a width offset and a depth offset.

Moreover, in some embodiments, the first offset width $W_{off,1}$ and the second offset width $W_{off,2}$ define an offset along an x-axis, and the first offset depth $D_{off,1}$ and second offset depth $D_{off,2}$ define an offset along a y-axis. The first offset width $W_{off,1}$ may be substantially equal to the first offset depth $D_{off,1}$. In other embodiments the first offset width $W_{off,1}$ may be different than the first offset depth $D_{off,1}$. In some embodiments, the second offset width $W_{off,2}$ may be substantially equal to the second offset depth $D_{off,2}$. In other embodiments, the second offset width $W_{off,2}$ may be different than the second offset depth $D_{off,2}$.

FIGS. 2-6 illustrate a series of cross-sectional views of some embodiments of a method for manufacturing a MEMS device by first hybrid bonding a CMOS wafer, which includes a number of CMOS integrated circuits (ICs), to a MEMS wafer, which includes a number of MEMS ICs, and then fusion bonding a cap wafer to the MEMS wafer.

FIG. 2 illustrates a cross-sectional view of some embodiments of a MEMS IC 217 (which is depicted in an inverted manner) over a CMOS IC 201. Although only a single CMOS IC 201 and a single MEMS IC 217 are illustrated, it will be appreciated that this is a simplified representation and a CMOS wafer 102 and a MEMS wafer 218 typically include multiple ICs. The CMOS IC 201 may comprise a first metallization structure 202 disposed over a CMOS wafer 102 (also called a CMOS substrate). The CMOS wafer 102 may comprise any type of semiconductor body (e.g., silicon/CMOS bulk, SiGe, SOI, etc.). The CMOS IC 201 may also comprise one or more semiconductor devices disposed over/within the CMOS wafer 102. For example, the one or more semiconductor devices may be a transistor comprising a gate stack 108 (e.g., a metal gate disposed over a high-k dielectric), a source 110, and a drain 112. In some embodiments, a bottom surface of the CMOS wafer 102 defines a bottom surface of the CMOS IC 201.

The first metallization structure 202 may comprise a plurality of conductive features, for example, a first metallization structure conductive contact 204, a first metallization structure conductive line 206, a first metallization structure conductive via 208, and a first metallization structure contact pad 210 disposed between the first metallization structure ILD material 212. For example, a first metallization structure conductive contact 204 may couple a gate electrode of the gate stack 108 to a first metallization structure conductive line 206. In some embodiments, the first metallization structure 202 may comprise one or more metal layers (e.g., metal layer 1, metal layer 2, etc.) disposed over one another. In some embodiments, each metal layer may comprise one or more first metallization structure conductive lines 206 and one or more first metallization structure conductive vias 208. Some first metallization structure conductive vias 208 couple a first metallization structure conductive line 206 to a first metallization structure contact pad 210 that is disposed proximate an upper surface of the first metallization layer 202.

Further, in some embodiments, the first metallization structure 202 comprises a first sacrificial oxide layer 214 (e.g., $SiO_2$). A first vHF barrier 216 may be disposed between sidewalls of the first sacrificial oxide layer 214 and portions of the first metallization structure ILD material 212. The first vHF barrier 216 may also be disposed between a portion(s) of a bottom surface (or the entire bottom surface) of the first sacrificial oxide layer 214 and a portion(s) of the first metallization structure ILD material 212. In some embodiments, the first vHF barrier layer 216 is made of aluminum oxide ($AlO_2$), silicon-rich nitride, titanium tungsten (TiW), or amorphous silicon, for example. After forming the first vHF barrier 216, the first sacrificial oxide layer 214, which may comprise $SiO_2$, may be formed over the first vHF barrier 216 by semiconductor deposition process(es), for example, a high density plasma CVD process. In some embodiments, a chemical mechanical polishing (CMP) process may be used on a top surface of the first metallization structure 202 to form a substantially planar top surface of the first metallization structure 202. In some embodiments, the top surface of the first metallization structure 202 may comprise a top surface of a first metallization structure contact pad 210, a top surface of a first vHF layer 216, a top surface of a first metallization structure ILD material 212, and/or a top surface of the first sacrificial oxide layer 214. In some embodiments, a top surface of the first metallization structure 202 defines a top surface of the CMOS IC 201.

In some embodiments, the MEMS IC 217 may comprise a second metallization structure 220 disposed over a MEMS wafer 218 (also called a MEMS substrate). The MEMS wafer 218 may comprise any type of semiconductor body, such as silicon/CMOS bulk, SiGe, etc. In some embodiments, a bottom surface of the MEMS wafer 218 defines a bottom surface of the MEMS IC 217. The second metallization structure 220 may comprise a plurality of conductive features, for example, a second metallization structure conductive contact (not shown), a second metallization structure conductive line 206 (not shown), a second metallization structure conductive via 208 (not shown), and a second metallization structure contact pad 224 disposed within a second metallization structure ILD material 222. For example, a second metallization structure conductive contact may couple a semiconductor device to a second metallization structure conductive line. In some embodiments, the second metallization structure 220 may comprise one or more metal layers (e.g., metal layer 1, metal layer 2, etc.) disposed over one another. In some embodiments, each metal layer may comprise one or more second metallization structure conductive lines and one or more second metallization structure conductive vias. Some second metallization structure conductive vias couple a second metallization structure conductive line to a second metallization structure contact pad 224 that is disposed proximate an upper surface of the second metallization layer 220.

Moreover, the second metallization structure 220 may comprise a second sacrificial oxide layer 226 (e.g., $SiO_2$). A second vHF barrier 228 may be disposed between sidewalls of the second sacrificial oxide layer 226 and portions of the second metallization structure ILD material 222. The second vHF barrier 228 may also be disposed between a portion(s) of a bottom surface (or the entire bottom surface) of the second sacrificial oxide layer 226 and a portion(s) of the second metallization structure ILD material 222. In some embodiments, the second vHF barrier layer 228 is made of aluminum oxide ($AlO_2$), silicon-rich nitride, titanium tungsten (TiW), or amorphous silicon, for example. After the second metallization structure 220 is formed, a CMP process may be used on a top surface of the second metallization structure 220 to form a substantially planar top surface of the second metallization structure 220. In some embodiments, the top surface of the second metallization structure 220 may comprise a top surface of a second metallization structure contact pad 224, a top surface of a second vHF layer 228, a top surface of a second metallization structure ILD material 222, and/or a top surface of the second sacrificial oxide layer 226. In some embodiments, a top surface of the second metallization structure 220 defines a top surface of the MEMS IC 217.

FIG. 3 illustrates a cross-sectional view of some embodiments of a top surface of the first metallization structure 202 being bonded to a top surface of the second metallization structure 220. In some embodiments, the top surface of the first metallization structure 202 and the top surface of the second metallization structure 220 may undergo an activation process (e.g., plasma-activation) to prepare the top surfaces for hybrid bonding. In some embodiments, the top surfaces may also undergo a cleaning process comprising, for example, exposure to deionized $H_2O$, exposure to $NH_4OH$, exposure to diluted hydrofluoric acid, and/or use of a cleaning tool, such as, a brush, mega-sonic cleaner, etc.

A second metallization structure contact pad 224 is then aligned with a first metallization structure contact pad 210, for example, by optical sensing. Also, the top surface of the first metallization structure ILD material 212, first vHF barrier 216, and first sacrificial oxide layer 214 are respectively aligned with the top surface of the second metallization structure ILD 222, the second vHF barrier 228, and the second sacrificial oxide layer 226. After alignment, the top surface of the first metallization structure 202 may be bonded to the top surface of the second metallization structure 220 by a hybrid bond. A relatively weak bond between the top surface of the first metallization structure 202 and the second metallization structure 220 is formed by applying a pressure for a relatively short period of time at a relatively low temperature (e.g., room temperature). After the top surfaces are bonded together by a relatively weak bond, to ensure an adequate bond strength, the bonded wafers are subjected to an annealing process (e.g., a furnace anneal) at a relatively high temperature (e.g., 400° C.-1000° C.) based on the chemical composition of the materials disposed in the first metallization structure 202 and the second metallization structure 220.

The hybrid bonding process results in a metal-to-metal bond that is formed between the first metallization structure contact pad 210 and the second metallization structure contact pad 224. A non-metal-to-non-metal bond is also formed between the second metallization structure ILD material 222 and the first metallization structure ILD material 212. Further, in some embodiments, a bond between the first vHF barrier 216 and the second vHF barrier 228 is formed. Rather than forming only one type of bond, as is with other types of wafer-to-wafer bonding (e.g., fusion bonding), the hybrid bonding process forms two separate bond types using a single bonding process.

FIG. 4 illustrates a cross-sectional view of some embodiments of the MEMS wafer 218, after the first metallization structure 202 is bonded to the second metallization structure 220, being thinned down, patterned, and etched to form a patterned MEMS wafer 410. In some embodiments, a bottom surface of the MEMS wafer 218 may be thinned down from a first thickness $t_1$ to a second thickness $t_2$. The thickness of the MEMS wafer 218 may be reduced by wet etching, dry etching, and/or CMP, for example. The MEMS wafer 218 may undergo a subsequent CMP process to correct any damage caused by the previous thickness reducing process and to ensure the bottom surface of the MEMS wafer 218 is substantially smooth. In some embodiments, an oxide layer (not shown) (e.g., $SiO_2$, $SiO_xN_y$, $Si_3N_4$) may be subsequently deposited over the MEMS wafer 218 by high density plasma CVD process, for example. The oxide layer (not shown) may undergo a subsequent CMP process to ensure a top surface of the oxide layer is substantially smooth.

The MEMS wafer 218 is patterned and etched to form the patterned MEMS wafer 410. The patterned MEMS wafer 410 comprises a MEMS element 412, which may be a proof mass, for example. In some embodiments, the MEMS element 412 may be formed by applying a photoresist (e.g., spin coating) to the bottom surface of a thinned down MEMS wafer 218. A light source (e.g., UV light) is then projected through a photomask to pattern the photoresist. The thinned MEMS wafer 218 then undergoes an etching process (e.g., plasma etching, wet etching, or a combination thereof) to form the MEMS element 412.

FIG. 4 also illustrates the first metallization structure 202 and second metallization structure 220 bonded together to form a bonded metallization structure 402. In some embodiments, the bonded metallization structure 402 comprises a bonded contact pad 404, bonded vHF barrier 414, bonded sacrificial oxide structure 416, the first metallization structure conductive contact 204, the first metallization structure conductive line 206, and the first metallization structure conductive via 208 disposed between a bonded ILD material 406. The bonded sacrificial oxide structure 416 comprises the first sacrificial oxide layer 216 and the second sacrificial oxide layer 226 layer bonded together at a bonding interface 408. The bonded vHF barrier 414 comprises the first vHF barrier 216 and the second vHF barrier 228 bonded together at a bonding interface 408. The bonded ILD material 406 comprises the first metallization structure ILD material 212 and the second metallization structure ILD material 222 bonded together at a bonding interface 408. The bonded contact pad 404 comprises the first metallization structure contact pad 210 and the second metallization structure contact pad 224 bonded together at a bonding interface 408.

In some embodiments, the bonded contact pad 404 may have a sidewall with a first portion (e.g., below the bonding interface 408) that is offset from a second portion (e.g., above the bonding interface 408) by a width. For example, the first portion of the bonded contact pad 404 may have a first width $W_1$, and the second portion of the bonded contact pad 404 may have a second width $W_2$. In some embodiments, the first width $W_1$ is substantially equal to the second width $W_2$. In other embodiments, the first width $W_1$ may be different than the second width $W_2$. In various embodiments, due to misalignment during bonding of the first metallization structure contact pad 210 and the second metallization structure contact pad 224, a first sidewall of the first portion of the bonded contact pad 404 will be offset from a first sidewall of the second portion of the bonded contact pad 404 by a first offset width $W_{off,1}$, and a second sidewall of the first portion of the bonded contact pad 404 will be offset from a second sidewall of the second portion of the bonded contact pad 404 by a second offset width $W_{off,2}$. In some embodiments, the first offset width $W_{off,1}$ may be substantially equal to the second offset width $W_{off,2}$. In other embodiments, the first offset width $W_{off,1}$ may be different than the second offset width $W_{off,2}$. Each of the bonded structures (e.g., the bonded contact pad 404, bonded vHF barrier 414, and/or bonded sacrificial oxide structure 416) may have sidewalls that are offset.

Further, in some embodiments, the first portion of the bonded contact pad 404 has a first depth $D_1$, and the second portion of the bonded contact pad 404 has a second depth $D_2$. In some embodiments, the first depth $D_1$ is substantially equal to the second depth $D_2$. In other embodiments, the first depth $D_1$ may be different than the second depth $D_2$. In various embodiments, due to misalignment during bonding of the first metallization structure contact pad 210 and the second metallization structure contact pad 224, a third sidewall of the first portion of the bonded contact pad 404 will be offset from a third sidewall of the second portion of the bonded contact pad 404 by a first offset depth $D_{off,1}$, and a fourth sidewall of the first portion of the bonded contact pad 404 will be offset from a fourth sidewall of the second portion of the bonded contact pad 404 by a second offset depth $D_{off,2}$. In some embodiments, the first offset depth $D_{off,1}$ may be substantially equal to the second offset depth $D_{off,2}$. In other embodiments, the first offset depth $D_{off,1}$ may be different than the second offset depth $D_{off,2}$.

FIG. 5 illustrates a cross-sectional view of some embodiments of forming a bonded metallization structure opening 502 in the bonded metallization structure 402 to create a movable MEMS element 504. For example, after the patterned MEMS wafer 410 is formed, the bonded sacrificial oxide structure 416 may be removed by a hydrogen fluoride etching process (e.g., vapor or wet) to form a bonded metallization structure opening 502. In other embodiments, other etching process(es) may be used to remove the sacrificial oxide structure 416. By forming the bonded metallization structure opening 502, a movable MEMS element 504 is formed that may move freely about an axis.

FIG. 6 illustrates a cross-sectional view of some embodiments of a cap wafer 602 being fusion bonded to a bottom surface of the patterned MEMS wafer 410. The cap wafer 602 may comprise any type of semiconductor body (e.g., silicon/CMOS bulk, SiGe, SOI, etc.). The cap wafer 602 may comprise a cap wafer cavity 604. A bottom boundary of the cap wafer cavity 604 may be defined by an upper surface of the cap wafer 602. Side boundaries of the cap wafer cavity 604 may be defined by sidewalls of the cap wafer 602. A top boundary of the cap wafer cavity 604 may be coplanar with an uppermost surface of the cap wafer 602. The cap wafer cavity 604 ensures the movable MEMS element may move freely about an axis.

In some embodiments, an outgas layer 608 may be disposed on the upper surface of the cap wafer 602 that defines the bottom boundary of the cap wafer cavity 604. The outgas layer 608 may comprise polysilicon or any suitable metal. In some embodiments, the outgas layer 608 may comprise a dielectric material (e.g., $SiO_2$). For example, in some embodiments, a dielectric layer may be disposed on a portion of the upper surface of the cap wafer 602 that defines the bottom boundary of the cap wafer cavity 604. In other embodiments, the outgas layer 608 may be disposed along the entire sidewalls of the cap wafer 602 that define the side boundaries of the cap wafer cavity 604 and on the entire upper surface of the cap wafer 602 that defines the bottom boundary of the cap wafer cavity 604. The outgas layer 608 is formed to regulate the final pressure inside the cap wafer cavity 604 after the cap wafer 602 is fusion bonded to the patterned MEMS wafer 410. By varying the thickness of the outgas layer 608, the final pressure inside the cap wafer cavity 604 may be controlled.

Prior to fusion bonding, in some embodiments, a dielectric bonding layer 606 (e.g., $SiO_2$) may be disposed over the cap wafer 602. In other embodiments, the cap wafer 602 may be fusion bonded to the patterned MEMS wafer 410 without a dielectric bonding layer 606. For example, after a dielectric bonding layer 606 is formed over the cap wafer 602, the cap wafer is inverted (as depicted in FIG. 6) and aligned over the patterned MEMS wafer 410. The cap wafer 602 is then fusion bonded to the patterned MEMS wafer 410 by an alignment vacuum fusion bond, for example. To ensure adequate bond strength, the bonded patterned MEMS wafer 410 and cap wafer 602 are subjected to an annealing process (e.g., a furnace anneal) at a relatively high temperature based on the chemical composition (e.g., Si—$SiO_2$ or Si—Si) of the patterned MEMS wafer 410 and the cap wafer 602. Unlike the hybrid bonding process, the fusion bonding process forms a single bond type in a single bonding process. With the cap wafer 602 bonded to the MEMS wafer 410, the wafers are singulated into dies, each including at least one MEMS device, and packaging is completed.

Figure 7:
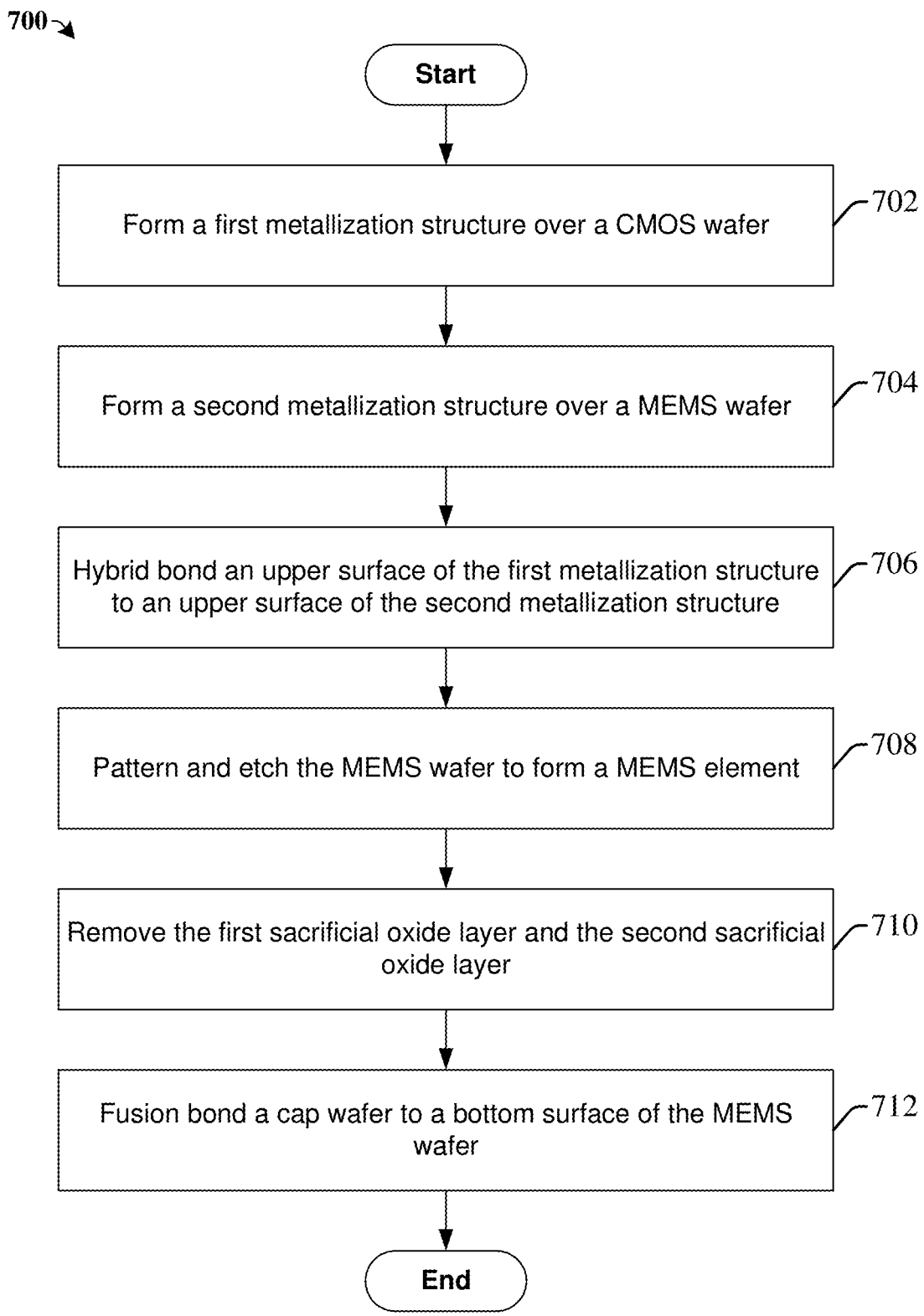
FIG. 7 illustrates some embodiments of a method for forming a MEMS device in accordance with the improved method for packing wafers of the present disclosure.

FIG. 7 illustrates some embodiments of a method 700 for forming a MEMS device in accordance with the improved method for packing wafers of the present disclosure. While the disclosed method 700 and other methods illustrated and/or described herein may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In 702, a first metallization structure is formed over a CMOS wafer. An example of act 702 can be seen with regards to previously illustrated FIG. 2.

In 704, a second metallization structure is formed over a MEMS wafer. An example of act 704 can be seen with regards to previously illustrated FIG. 2.

In 706, an upper surface of the first metallization structure is hybrid bonded to an upper surface of the second metallization structure. An example of act 706 can be seen with regards to previously illustrated FIG. 3.

In 708, a MEMS wafer is patterned and etched to form a MEMS element. An example of act 708 can be seen with regards to previously illustrate FIG. 4.

In 710, the first sacrificial oxide layer and second sacrificial oxide layer are removed. An example of act 710 can be seen with regards to previously illustrated FIG. 5.

In 712, a cap wafer is fusion bonded to a bottom surface of the MEMS wafer. An example of act 712 can be seen with regards to previously illustrated FIG. 6.

FIGS. 8-12 illustrate a series of cross-sectional views of some additional embodiments of a method for manufacturing a MEMS device by first hybrid bonding a CMOS wafer, which includes a number of CMOS ICs, to a MEMS wafer, which includes a number of MEMS ICs, and then fusion bonding a cap wafer to the MEMS wafer.

Figure 8:
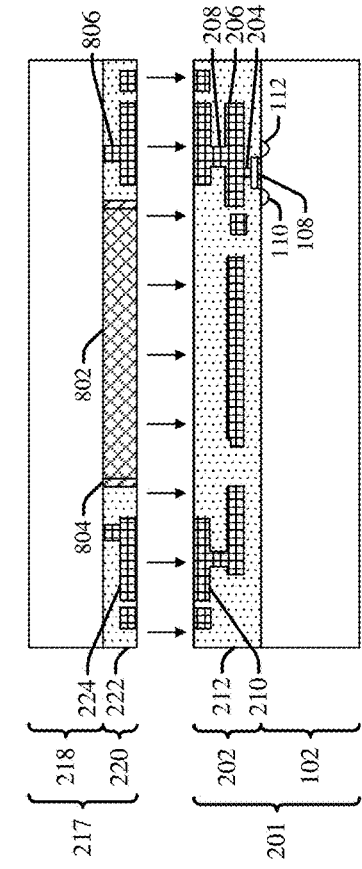
FIGS. 8-12 illustrate a series of cross-sectional views of some additional embodiments of a method for manufacturing a MEMS device by first hybrid bonding a CMOS wafer, which includes a number of CMOS ICs, to a MEMS wafer, which includes a number of MEMS ICs, and then fusion bonding a cap wafer to the MEMS wafer.

FIG. 8 illustrates a cross-sectional view of some additional embodiments of a MEMS IC 217 (which is depicted in an inverted manner) over a CMOS IC 201. As illustrated, a sacrificial oxide layer 802 is formed within the second metallization structure 220 but not within the first metallization structure 202. In some embodiments, a vHF barrier 804 may be formed between a sidewall(s) of the sacrificial oxide layer 802 and the second metallization structure ILD material 222. In other embodiments, the vHF barrier 804 may also be formed over a top surface of the sacrificial oxide layer 802 and/or a portion of the top surface of the second metallization structure 220.

Figure 9:
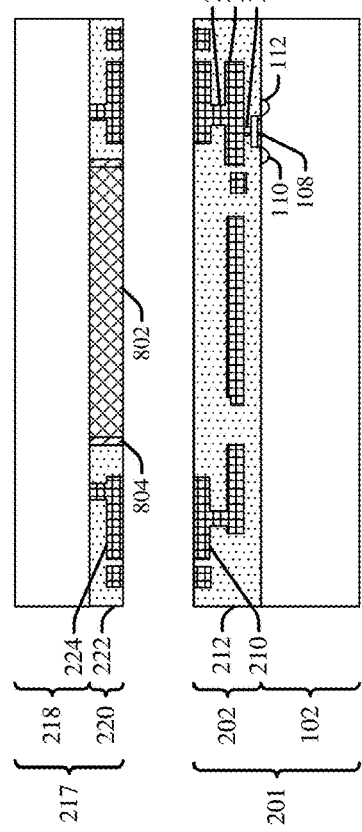

FIG. 9 illustrates a cross-sectional view of some additional embodiments of a top surface of the first metallization structure 202 being bonded to a top surface of the second metallization structure 220. As illustrated, a top surface of the first metallization structure 202 and a top surface of the second metallization structure 222 are bonded together by a hybrid bond. In some embodiments, because the sacrificial oxide layer 802 is formed only in the second metallization structure 220, a top surface of the sacrificial oxide layer 802 and a top surface of the vHF barrier 804 are bonded to a top surface of the first metallization structure ILD material 212.

Figure 10:
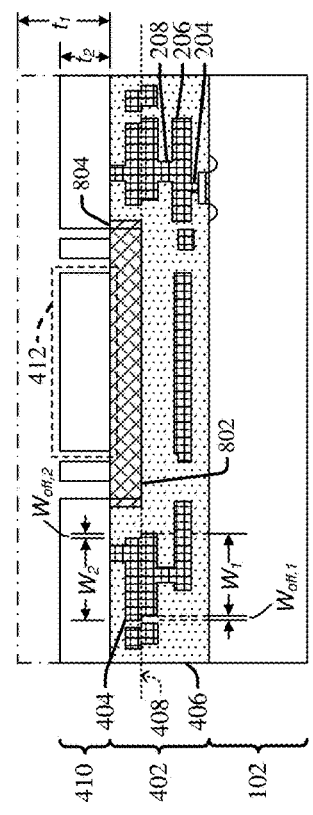

FIG. 10 illustrates a cross-sectional view of some additional embodiments of the MEMS wafer 218, after the first metallization structure 202 is bonded to the second metallization structure 220, being thinned down, patterned, and etched to form a patterned MEMS wafer 410.

Figure 11:
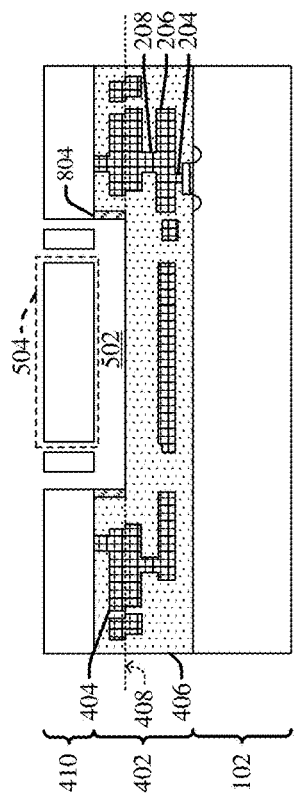

FIG. 11 illustrates a cross-sectional view of some embodiments of forming a bonded metallization structure opening 502 in the bonded metallization structure 402 to create a movable MEMS element 504. For example, after the patterned MEMS wafer 410 is formed, the sacrificial oxide structure 802 may be removed by a hydrogen fluoride etching process (e.g., vapor or wet) to form a bonded metallization structure opening 502. In other embodiments, other etching process(es) may be used to remove the sacrificial oxide structure 802. By forming the bonded metallization structure opening 502, a movable MEMS element 504 is formed that may move freely about an axis.

Figure 12:
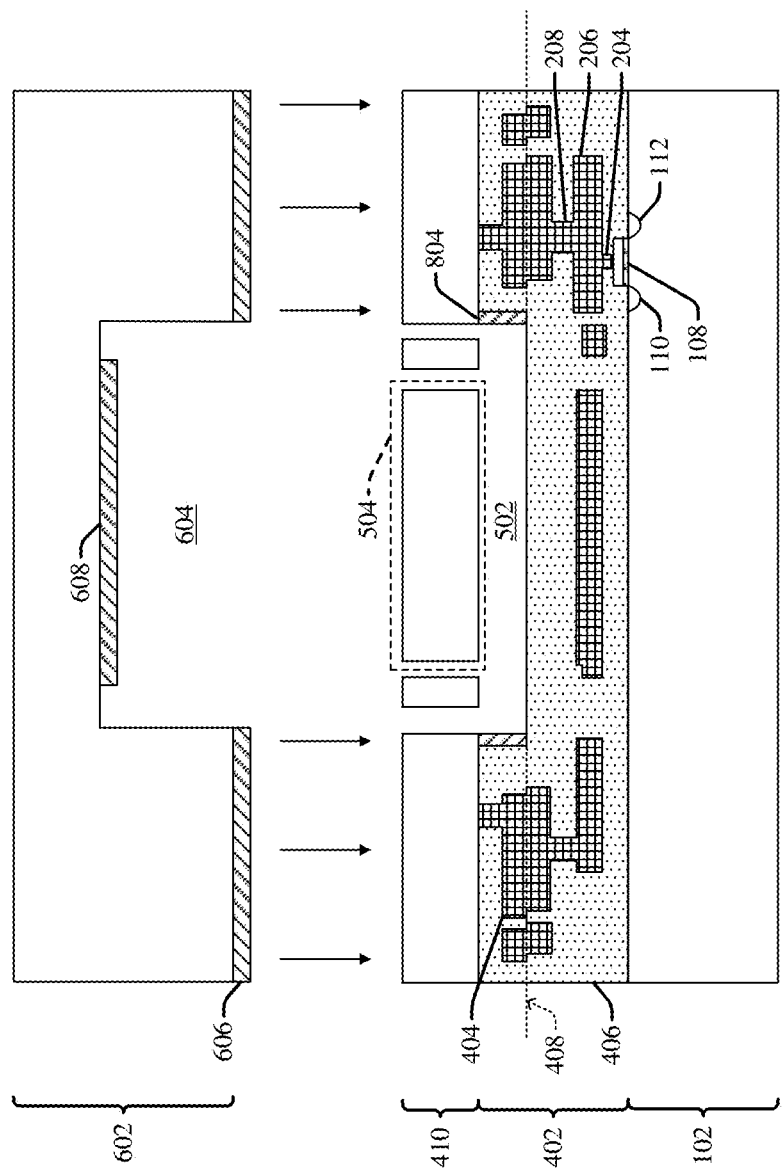

FIG. 12 illustrates a cross-sectional view of some additional embodiments of a cap wafer 602 being fusion bonded to a bottom surface of the patterned MEMS wafer 410.

FIGS. 13-17 illustrate a series of cross-sectional views of some additional embodiments of a method for manufacturing a MEMS device by first hybrid bonding a CMOS wafer, which includes a number of CMOS ICs, to a MEMS wafer, which includes a number of MEMS ICs, and then fusion bonding a cap wafer to the MEMS wafer.

Figure 13:
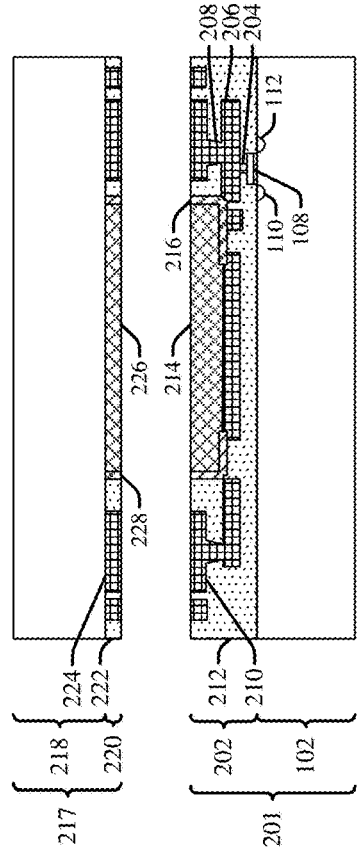

FIG. 13 illustrates a cross-sectional view of some additional embodiments of a MEMS IC 217 (which is depicted in an inverted manner) over a CMOS IC 201

Figure 14:
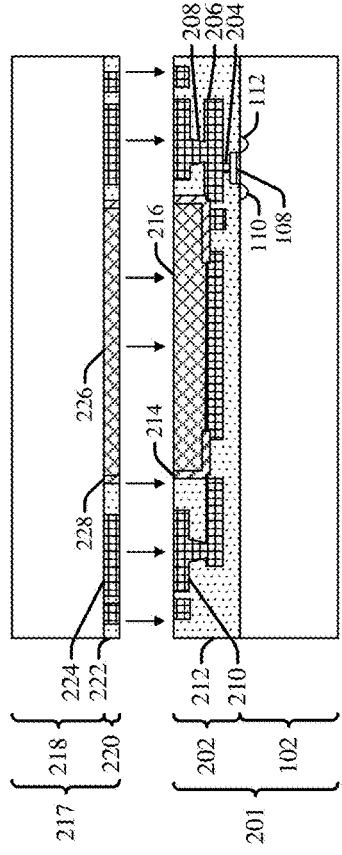
FIGS. 13-17 illustrate a series of cross-sectional views of some additional embodiments of a method for manufacturing a MEMS device by first hybrid bonding a CMOS wafer, which includes a number of CMOS ICs, to a MEMS wafer, which includes a number of MEMS ICs, and then fusion bonding a cap wafer to the MEMS wafer.

FIG. 14 illustrates a cross-sectional view of some additional embodiments of a top surface of the first metallization structure 202 being bonded to a top surface of the second metallization structure 220.

Figure 15:
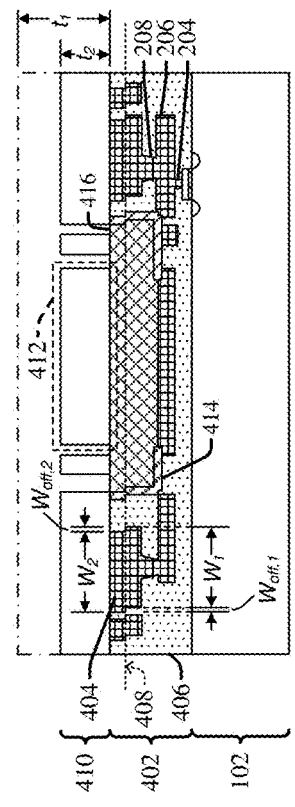

FIG. 15 illustrates a cross-sectional view of some additional embodiments of the MEMS wafer 218, after the first metallization structure 202 is bonded to the second metallization structure 220, being thinned down, patterned, and etched to form a patterned MEMS wafer 410.

Figure 16:
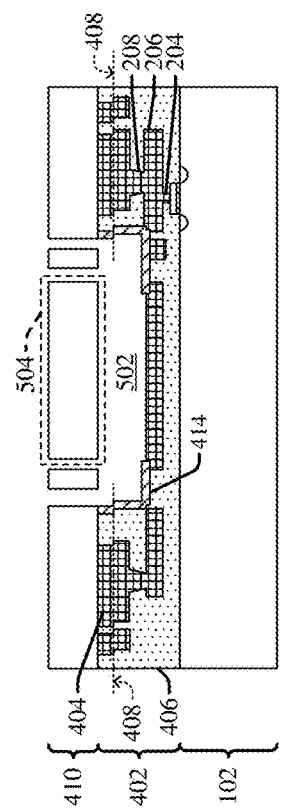

FIG. 16 illustrates a cross-sectional view of some additional embodiments of forming a bonded metallization structure opening 502 in the bonded metallization structure 402 to create a movable MEMS element 504.

Figure 17:
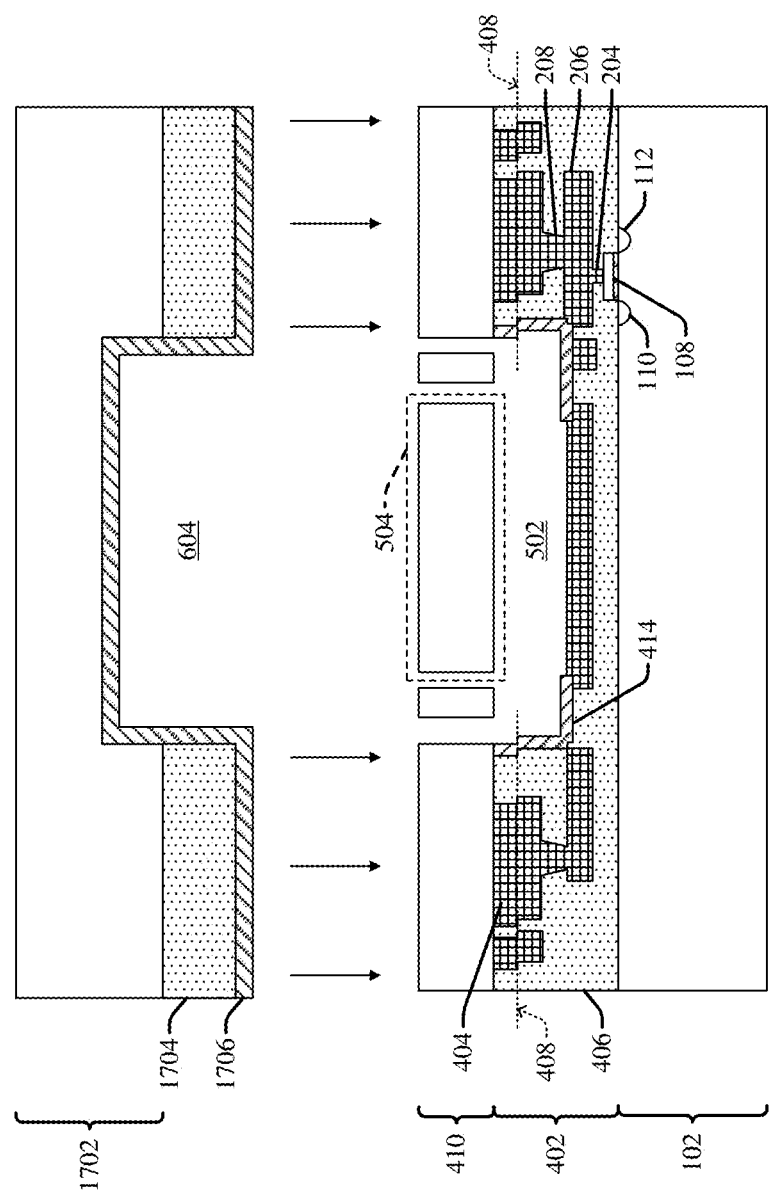

FIG. 17 illustrates a cross-sectional view of some additional embodiments of a cap wafer 1702 being fusion bonded to a bottom surface of the patterned MEMS wafer 410. As illustrated, in some embodiments, a cap wafer dielectric layer 1704 (e.g., $SiO_2$) may be formed over the cap wafer 1702. For example, the cap wafer dielectric layer 1704 may be formed on a top surface of the cap wafer 1702 by ALD, PVD, CVD, or PECVD, for example. After the cap wafer dielectric layer 1704 is formed, a cap wafer cavity 604 may be formed in the cap wafer 1702 and the cap wafer dielectric layer 1704 with various semiconductor processes (e.g., photolithography coupled with dry/wet etching). In some embodiments, an outgas layer 1706 may be formed over a top surface of the cap wafer dielectric layer 1704, along sidewalls of the cap wafer 602 that define the side boundaries of the cap wafer cavity 604, and/or on an upper surface of the cap wafer 602 that defines the bottom boundary of the cap wafer cavity 604.

Thus, as can be appreciated from above, the present disclosure relates to an improved method (and related apparatus) for packaging wafers that increases the number of MEMS devices that can be manufactured per hour and improves the overlay accuracy of MEMS wafer packaging.

In one embodiment, the method for packaging wafers includes forming a first metallization structure over a complementary metal-oxide-semiconductor (CMOS) wafer, wherein the first metallization structure includes a first sacrificial oxide layer and a first metal contact pad. A second metallization structure is formed over a MEMS wafer, wherein the second metallization structure includes a second sacrificial oxide layer and a second metal contact pad. The first metallization structure and the second metallization structure are bonded together, wherein an upper surface of the first sacrificial oxide layer is bonded to an upper surface of the second sacrificial oxide layer and an upper surface of the first metal contact pad is bonded to an upper surface of the second metal contact pad. After the first metallization structure and second metallization structure are bonded together, patterning and etching the MEMS wafer. After the first metallization structure and second metallization structure are bonded together, removing the first sacrificial oxide layer and second sacrificial oxide layer to form a movable MEMS element.

In other embodiments, the method for packaging wafers includes forming a first metallization structure over a first wafer, wherein the first metallization structure includes a first metal contact pad. A second metallization structure is formed over a second wafer, wherein the second metallization structure comprises a sacrificial oxide layer and a second metal contact pad. The first metallization structure and second metallization structure are hybrid bonded together. After the first metallization structure and second metallization structure are bonded together, reducing a thickness of the second wafer. After reducing the thickness of the second wafer, patterning and etching the second wafer to form a MEMS element over the sacrificial oxide layer. After the second wafer is patterned and etched to form the MEMS element, etching the sacrificial oxide layer, wherein etching the sacrificial oxide layer allows the MEMS element to move freely about an axis In some embodiments, the MEMS device includes a semiconductor device disposed over a complementary metal-oxide-semiconductor (CMOS) substrate. A metallization structure including a first metal contact pad that abuts a top surface of a second metal contact pad is disposed over the CMOS substrate and configured to connect the semiconductor device to the first metal contact pad and the second metal contact pad, wherein the first metal contact pad has a first outermost sidewall that is offset from a first outermost sidewall of the second metal contact pad along a first axis. A metallization structure opening is disposed within the metallization structure and has a bottom boundary disposed between an uppermost surface of the metallization structure and an uppermost surface of the CMOS substrate. A MEMS substrate is disposed over the metallization structure, wherein a movable element is disposed within the MEMS substrate, wherein outermost sidewalls of the movable element are disposed within outermost sidewalls of the metallization structure opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical system (MEMS) device, comprising:
a metallization structure disposed over a first semiconductor substrate, wherein the metallization structure comprises a plurality of conductive features embedded in a dielectric structure, wherein the dielectric structure has a first portion disposed over a second portion, and wherein a first sidewall of the first portion of the dielectric structure is laterally spaced from a first sidewall of the second portion of the dielectric structure;
a cavity disposed in the metallization structure, wherein the cavity is disposed laterally between the first sidewall of the first portion of the dielectric structure and a second sidewall of the first portion of the dielectric structure opposite the first sidewall of the first portion of the dielectric structure; and
a second semiconductor substrate disposed over the metallization structure, wherein the second semiconductor substrate comprises a movable element disposed within the cavity.

2. The MEMS device of claim 1, wherein the cavity is disposed laterally between the first sidewall of the second portion of the dielectric structure and a second sidewall of the second portion of the dielectric structure opposite the first sidewall of the second portion of the dielectric structure.

3. The MEMS device of claim 2, wherein:
the first sidewall of the first portion of the dielectric structure is laterally spaced from the first sidewall of the second portion of the dielectric structure in a lateral direction; and
the second sidewall of the first portion of the dielectric structure is laterally spaced from the second sidewall of the second portion of the dielectric structure in the lateral direction.

4. The MEMS device of claim 3, wherein the lateral direction extends laterally in parallel with an upper surface of the first semiconductor substrate.

5. The MEMS device of claim 4, wherein:
the first sidewall of the first portion of the dielectric structure is laterally spaced from the first sidewall of the second portion of the dielectric structure by a first distance; and
the second sidewall of the first portion of the dielectric structure is laterally spaced from the second sidewall of the second portion of the dielectric structure by a second distance that is substantially the same as the first distance.

6. The MEMS device of claim 2, wherein:
the first sidewall of the first portion of the dielectric structure and the first sidewall of the second portion of the dielectric structure are both disposed on a first side of the cavity; and
the second sidewall of the first portion of the dielectric structure and the second sidewall of the second portion of the dielectric structure are both disposed on a second side of the cavity opposite the first side of the cavity.

7. The MEMS device of claim 1, further comprising:
a barrier structure disposed in the metallization structure, wherein:
the barrier structure has a first portion disposed over a second portion;
the first portion of the barrier structure is disposed along the first sidewall of the first portion of the dielectric structure;
the second portion of the barrier structure is disposed along the first sidewall of the second portion of the dielectric structure;
the first portion of the dielectric structure overhangs the first sidewall of the second portion of the dielectric structure; and
the first portion of the barrier structure overhangs a sidewall of the second portion of the barrier structure.

8. A microelectromechanical system (MEMS) device, comprising:
a metallization structure disposed over a first semiconductor substrate, wherein the metallization structure comprises a conductive interconnect structure disposed in an interlayer dielectric (ILD) structure, wherein the ILD structure has a first portion overlying a second portion, and wherein the first portion of the ILD structure overhangs a first sidewall of the second portion of the ILD structure;
a cavity disposed in the metallization structure, wherein the cavity is disposed laterally between the first sidewall of the second portion of the ILD structure and a second sidewall of the second portion of the ILD structure opposite the first sidewall of the second portion of the ILD structure; and
a second semiconductor substrate disposed over the metallization structure, wherein the second semiconductor substrate comprises a movable element disposed laterally between the first sidewall of the second portion of the ILD structure and the second sidewall of the second portion of the ILD structure.

9. The MEMS device of claim 8, wherein:
a first sidewall of the first portion of the ILD structure is laterally spaced from the first sidewall of the second portion of the ILD structure;
both the first sidewall of the first portion of the ILD structure and the first sidewall of the second portion of the ILD structure are disposed on a same side of the cavity; and
a lower surface of the first portion of the ILD structure extends laterally from the first sidewall of the first portion of the ILD structure to the first sidewall of the second portion of the ILD structure.

10. The MEMS device of claim 9, wherein:
the cavity is disposed laterally between the first sidewall of the first portion of the ILD structure and a second sidewall of the first portion of the ILD structure opposite the first sidewall of the first portion of the ILD structure;
the second sidewall of the first portion of the ILD structure is laterally spaced from the second sidewall of the second portion of the ILD structure; and
an upper surface of the second portion of the ILD structure extends laterally from the second sidewall of the second portion of the ILD structure to the second sidewall of the first portion of the ILD structure.

11. The MEMS device of claim 10, wherein the lower surface of the first portion of the ILD structure and the upper surface of the second portion of the ILD structure both lie along a bonding interface that extends laterally through the metallization structure, and wherein the bonding interface comprises non-metal to non-metal bonds between the first portion of the ILD structure and the second portion of the ILD structure.

12. The MEMS device of claim 11, wherein the bonding interface extends laterally in parallel with an upper surface of the first semiconductor substrate.

13. The MEMS device of claim 12, wherein:
the bonding interface is vertically spaced from the first semiconductor substrate by a first distance; and
the bonding interface is vertically spaced from the second semiconductor substrate by a second distance that is less than the first distance.

14. The MEMS device of claim 10, wherein:
the lower surface of the first portion of the ILD structure has a first length measured from the first sidewall of the first portion of the ILD structure to the first sidewall of the second portion of the ILD structure;
the upper surface of the second portion of the ILD structure has a second length measured from the second sidewall of the second portion of the ILD structure to the second sidewall of the first portion of the ILD structure; and
the first length is substantially the same as the second length.

15. The MEMS device of claim 8, further comprising:
a barrier structure disposed in the metallization structure, wherein:
a first sidewall of the first portion of the ILD structure is laterally spaced from the first sidewall of the second portion of the ILD structure;
both the first sidewall of the first portion of the ILD structure and the first sidewall of the second portion of the ILD structure are disposed on a same side of the cavity;
the barrier structure has a first portion disposed over a second portion;
the first portion of the barrier structure is disposed along the first sidewall of the first portion of the ILD structure;
the second portion of the barrier structure is disposed along the first sidewall of the second portion of the ILD structure; and
the first portion of the barrier structure overhangs a sidewall of the second portion of the barrier structure.

16. The MEMS device of claim 15, wherein a thickness of the first portion of the barrier structure is substantially the same as a thickness of the second portion of the barrier structure.

17. A microelectromechanical system (MEMS) device, comprising:
a metallization structure disposed over a first semiconductor substrate, wherein:
the metallization structure comprises a first contact pad disposed in a first portion of a dielectric structure;
the metallization structure comprises a second contact pad disposed in a second portion of the dielectric structure;
the first contact pad and the first portion of the dielectric structure are both disposed over the second contact pad and the second portion of the dielectric structure;
the first contact pad overlies and is bonded to the second contact pad;
a first sidewall of the first portion of the dielectric structure is laterally spaced from a first sidewall of the second portion of the dielectric structure in a lateral direction; and
a sidewall of the first contact pad is laterally spaced from a sidewall of the second contact pad in the lateral direction;
a cavity disposed in the metallization structure, wherein the cavity is disposed laterally between the first sidewall of the first portion of the dielectric structure and a second sidewall of the first portion of the dielectric structure opposite the first sidewall of the first portion of the dielectric structure, and wherein the first sidewall of the first portion of the dielectric structure, the first sidewall of the second portion of the dielectric structure, the sidewall of the first contact pad, and the sidewall of the second contact pad are each disposed on a same side of the cavity; and
a second semiconductor substrate disposed over the metallization structure, wherein the second semiconductor substrate comprises a movable element laterally disposed between the first sidewall of the first portion of the dielectric structure and the second sidewall of the first portion of the dielectric structure.

18. The MEMS device of claim 17, wherein:
the first sidewall of the first portion of the dielectric structure is laterally spaced from the first sidewall of the second portion of the dielectric structure by a first distance; and
the sidewall of the first contact pad is laterally spaced from the sidewall of the second contact pad by a second distance that is substantially the same as the first distance.

19. The MEMS device of claim 18, further comprising:
a barrier structure disposed in the metallization structure, wherein:
the barrier structure has a first portion disposed over a second portion;
the first portion of the barrier structure is disposed along the first sidewall of the first portion of the dielectric structure;
the second portion of the barrier structure is disposed along the first sidewall of the second portion of the dielectric structure; and
a sidewall of the first portion of the barrier structure is laterally spaced from a sidewall of the second portion of the barrier structure in the lateral direction.

20. The MEMS device of claim 19, wherein the sidewall of the first portion of the barrier structure is laterally spaced from the sidewall of the second portion of the barrier structure by a third distance that is substantially the same as the first distance.

* * * * *